(12) United States Patent
Jang et al.

(10) Patent No.: US 12,112,883 B2
(45) Date of Patent: Oct. 8, 2024

(54) MAGNETIC SHIELDING SHEET FOR WIRELESS POWER RECEPTION MODULE, AND WIRELESS POWER RECEPTION MODULE INCLUDING THE SAME

(71) Applicant: AMOSENSE CO., LTD, Cheonan-si (KR)

(72) Inventors: Kil Jae Jang, Cheonan-si (KR); Dong Hoon Lee, Cheonan-si (KR); Chol Han Kim, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 30 days.

(21) Appl. No.: 18/040,797

(22) PCT Filed: Jul. 14, 2021

(86) PCT No.: PCT/KR2021/009023
§ 371 (c)(1),
(2) Date: Feb. 6, 2023

(87) PCT Pub. No.: WO2022/030793
PCT Pub. Date: Feb. 10, 2022

(65) Prior Publication Data
US 2024/0029947 A1    Jan. 25, 2024

(30) Foreign Application Priority Data
Aug. 6, 2020  (KR) .......... 10-2020-0098706

(51) Int. Cl.
*H01F 27/36* (2006.01)
*H01F 38/14* (2006.01)
(Continued)

(52) U.S. Cl.
CPC ............. *H01F 27/36* (2013.01); *H01F 38/14* (2013.01); *H01Q 1/526* (2013.01); *H02J 50/10* (2016.02); *H02J 50/70* (2016.02)

(58) Field of Classification Search
CPC ....................................................... H01F 27/36
(Continued)

(56) References Cited

U.S. PATENT DOCUMENTS

| | | | |
|---|---|---|---|
| 2012/0112552 A1 | 5/2012 | Baarman et al. | |
| 2015/0123604 A1* | 5/2015 | Lee ........................ | B32B 37/18 |
| | | | 428/307.3 |

(Continued)

FOREIGN PATENT DOCUMENTS

| KR | 10-2014-0109336 A | 9/2014 |
|---|---|---|
| KR | 10-2015-0054740 A | 5/2015 |

(Continued)

OTHER PUBLICATIONS

Office Action for KR10-2020-0098706 by Korean Intellectual Property Office dated Feb. 10, 2023.

(Continued)

*Primary Examiner* — Joseph Chang
(74) *Attorney, Agent, or Firm* — BROADVIEW IP LAW, PC

(57) ABSTRACT

A magnetic shielding sheet for a wireless power reception module is provided. A magnetic shielding sheet for a wireless power reception module according to an exemplary embodiment of the present invention, which is applied to a wireless power reception module capable of a wireless power share (WPS) function and has an overall thickness of 150 μm or less. The magnetic shielding sheet includes a first sheet made of a magnetic material to shield a magnetic field, and a second sheet laminated as a monolayer on one surface of the first sheet by means of a bonding adhesive layer, (Continued)

wherein the second sheet is provided to have a smaller thickness than a thickness of the first sheet while having a saturation magnetic flux density twice or more than a saturation magnetic flux density of the first sheet.

12 Claims, 3 Drawing Sheets

(51) Int. Cl.
  *H01Q 1/52* (2006.01)
  *H02J 50/10* (2016.01)
  *H02J 50/70* (2016.01)
(58) Field of Classification Search
  USPC .......................................................... 307/104
  See application file for complete search history.

(56) References Cited

U.S. PATENT DOCUMENTS

2015/0351292 A1   12/2015  Chang et al.
2018/0286575 A1*  10/2018  Kyeong ................. H01F 38/14

FOREIGN PATENT DOCUMENTS

| KR | 20170017416 A | 2/2017 |
| KR | 10-2017-0051571 A | 5/2017 |
| KR | 20190011112 A | 2/2019 |

OTHER PUBLICATIONS

International Search Report for PCT/KR2021/009023 by Korean Intellectual Property Office dated Nov. 2, 2021.

* cited by examiner 111,112

111,112

MAGNETIC SHIELDING SHEET FOR WIRELESS POWER RECEPTION MODULE, AND WIRELESS POWER RECEPTION MODULE INCLUDING THE SAME

CROSS REFERENCE TO RELATED APPLICATION

This application is the national phase entry of International Application No. PCT/KR2021/009023, filed on Jul. 14, 2021, which is based upon and claims priority to Korean Patent Applications 10-2020-0098706, filed on Aug. 6, 2020, the entire contents of which are incorporated herein by reference.

TECHNICAL FIELD

The present invention relates to a magnetic shielding sheet for a wireless power reception module and a wireless power reception module including the same.

Background Art

Wireless charging is essentially a non-contact transmission method that is realized through an antenna configured to transmit or receive a magnetic field and a magnetic shielding sheet, which is disposed on one surface of the antenna to smoothly transmit or receive the magnetic field.

Typically, a sheet made of a magnetic material such as an amorphous ribbon sheet, a ferrite sheet, or a polymer sheet is used as the magnetic shielding sheet.

Among these, the ferrite sheet is widely used as the magnetic shielding sheet due to its high permeability, low loss, and low manufacturing cost. However, it is difficult to manufacture the ferrite sheet with a very small thickness because a sintering process is involved, and thus, the ferrite sheet was mainly used as a shielding sheet for a wireless power transmission module, which is not limited in thickness.

On the other hand, the amorphous ribbon sheet may have a high permeability while having a very small thickness, and thus is widely used as a shielding sheet for a wireless power reception module requiring a small thickness. However, the amorphous ribbon sheet has a disadvantage in that price competitiveness is low because a manufacturing cost thereof is very high as compared to the ferrite sheet.

Recently, as it becomes possible to manufacture the ferrite sheet with a very small thickness, for example, a thickness of 150 μm or less due to the development of technology, the ferrite sheet is being applied as the shielding sheet for a wireless power transmission module as well as a shielding sheet for a wireless power reception module requiring a small thickness.

When the ferrite sheet having a very small thickness is applied to a wireless power reception module, the wireless power reception module to which the ferrite sheet having a very small thickness is applied may receive wireless power transmitted frons a wireless power transmission module and charge a built-in battery without reducing charging efficiency.

However, a wireless battery sharing technology called wireless power share (WPS) has been recently applied to an electronic device such as a mobile phone or a laptop computer. The WPS is a function capable of wirelessly charging a battery of another electronic device such as a smart watch using a battery of an electronic device such as a mobile phone or a laptop computer.

That is, the wireless power reception module applied to an electronic device such as a mobile phone or a laptop computer basically performs a role as a reception module that charges a built-in battery wirelessly, and in WPS, the wireless power reception module is switched to a transmission module that wirelessly transmits power of its own battery to charge a battery of another electronic device such as a smart watch.

Meanwhile, permanent magnets are embedded in an electronic device such as a smart watch for various reasons such as easy attachment or detachment or position alignment.

However, the ferrite sheet has advantages of high permeability, low loss, and low manufacturing cost as described above, but has a disadvantage of being vulnerable to the effect of a permanent magnet due to a low saturation magnetic flux density.

Accordingly, when WPS is performed to charge a battery of an electronic device employing permanent magnets by using a wireless power reception module in which a ferrite sheet is employed as a magnetic shielding sheet, there is a problem in that magnetic saturation due to a magnetic field generated from the permanent magnets is generated in the ferrite sheet having a low saturation magnetic flux density, and charging efficiency is rapidly reduced.

This acts as an obstacle in smoothly realizing a WPS function using the wireless power reception module in which the ferrite sheet is employed as a magnetic shielding sheet.

SUMMARY OF THE INVENTION

The present invention is directed to providing a magnetic shielding sheet for a wireless power reception module, capable of preventing the charging efficiency of another electronic device, in which permanent magnets are employed, from being degraded during wireless power share (WPS) even when a ferrite sheet having a very small thickness is used as a shielding sheet of a wireless power reception e for a WPS function, and a wireless power reception module including the same.

One aspect of the present invention provides a magnetic shielding sheet for a wireless power reception module, which is applied to a wireless power reception module capable of a wireless power share (WPS) function and has an overall thickness of 150 μm or less, the magnetic shielding sheet including a first sheet made of a magnetic material to shield a magnetic field, and a second sheet laminated as a monolayer on one surface of the first sheet by means of a bonding adhesive layer, wherein the second sheet is provided to have a thickness smaller than a thickness of the first sheet while having a saturation magnetic flux density twice or more than a saturation magnetic flux density of the first sheet.

The thickness of the first sheet may be 2 to 6.7 times the thickness of the second sheet. As an example, the thickness of the first sheet may be 60 μm to 120 μm, and the thickness of the second sheet may be 18 μm to 30 μm.

The saturation magnetic flux density of the first sheet may be 0.1 to 0.5 times the saturation magnetic flux density of the second sheet. As an example, the saturation magnetic flux density of the first sheet may be 0.2 to 0.5 tesla (T), and the saturation magnetic flux density of the second sheet may be 1 to 2 T.

A permeability of the first sheet may be 0.05 to 12 times a permeability of the second sheet. As an example, the permeability of the first sheet may be 300 to 3600, and the permeability of the second sheet may be 300 to 6000.

The first sheet may be a ferrite sheet, and the second sheet may be a ribbon sheet of an amorphous alloy or a nanocrystalline alloy.

Each of the first sheet and the second sheet may be a sheet formed by being divided into a plurality of pieces.

The magnetic shielding sheet may include an attachment adhesive layer disposed on one surface of the first sheet, wherein a wireless power reception antenna may be attached to the one surface of the first sheet by means of the attachment adhesive layer.

Another aspect of the present invention provides a wireless power reception module including a wireless power reception antenna capable of a wireless power share (WPS) function, and a magnetic shielding sheet disposed on one surface of the wireless power reception antenna, wherein the magnetic shielding sheet is the above-described magnetic shielding sheet for a wireless power reception module.

According to the present invention, it is possible to secure price competitiveness by reducing manufacturing costs while enabling smooth wireless charging by preventing the degradation of the charging efficiency of another electronic device, in which permanent magnets are employed, during power sharing.

DETAILED DESCRIPTION OF THE INVENTION

Figure 1:
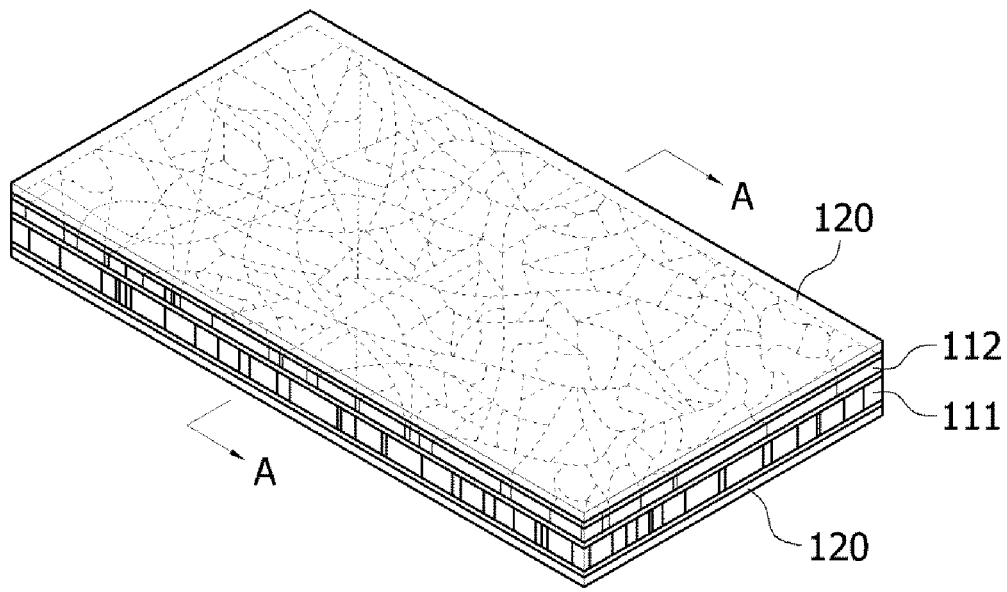
FIG. 1 is a view illustrating a magnetic shielding sheet for a wireless power reception module according to one embodiment of the present invention.

Hereinafter, embodiments of the present invention will be described in detail with reference to the accompanying drawings which may allow one of ordinary skill in the art to easily carry out the present invention. The present invention may be implemented in various forms and is not limited to the following embodiments. Parts not related to the description are not included in the drawings to clearly describe the present invention, and the same reference symbols are used for the same or similar components in the description.

A magnetic shielding sheet 100 for a wireless power reception module according to one embodiment of the present invention may be applied to a wireless power reception module capable of a wireless power share (WPS) function.

That is, the magnetic shielding sheet 100 for a wireless power reception module according to one embodiment of the present invention may be applied to a wireless power reception module, which may perform a role as a wireless power reception module that receives wireless power supplied from the outside and may be switched to a role as a wireless power transmission module that transmits wireless power to charge a battery of another electronic device.

In this case, the magnetic shielding sheet 100 for a wireless power reception module according to one embodiment of the present invention may satisfy a charging efficiency of 32% or more when wirelessly charging another electronic device using the WPS function while having a very small thickness with an overall thickness t of 150 μm or less.

Figure 2:
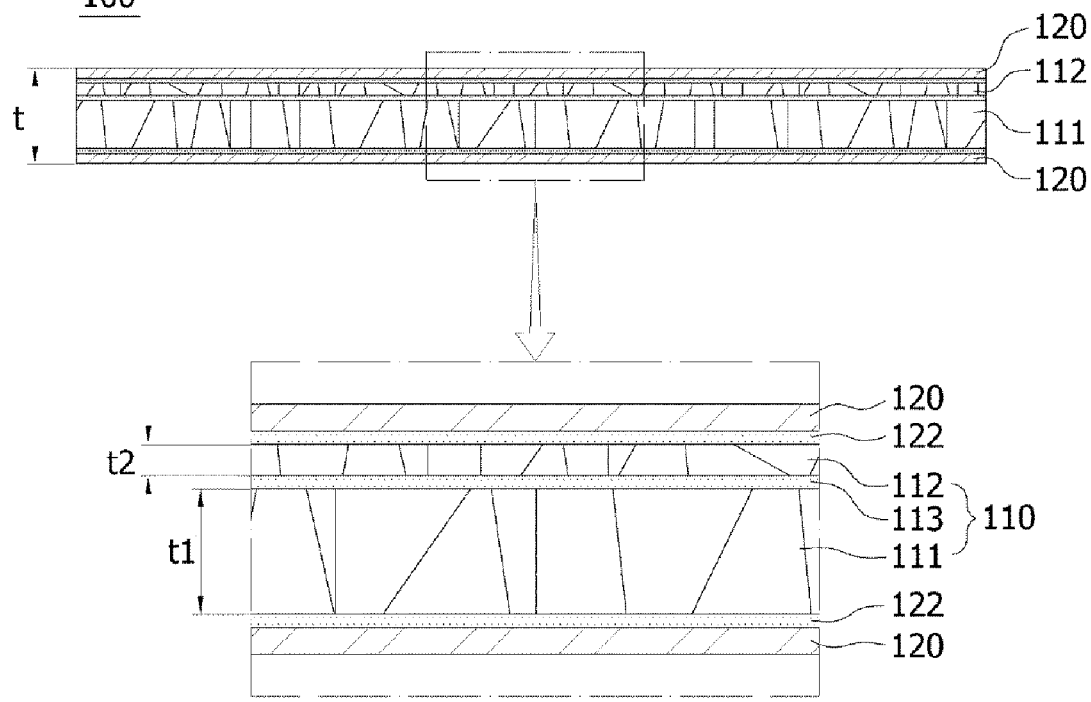
FIG. 2 is a cross-sectional view taken along line A-A of FIG. 1.

To this end, as shown in FIGS. 1 and 2, the magnetic shielding sheet 100 for a wireless power reception module according to one embodiment of the present invention may include a sheet body 110, and the sheet body 110 may include a first sheet 111 and a second sheet 112 having different properties.

Specifically, the sheet body 110 may be a multilayer sheet in which the second sheet 112 is laminated on one surface of the first sheet 111 by means of a bonding adhesive layer 113.

In this case, the first sheet 111 and the second sheet 112 may be made of a material having a magnetic property to shield a magnetic field, the first sheet 111 may serve as a main shielding sheet for shielding the magnetic field, and the second sheet 112 may serve to prevent magnetic saturation caused by a direct current (DC) magnetic field generated from permanent magnets while supplementing the performance of the first sheet 111.

To this end, the second sheet 112 may be provided to have a thickness t2, which is relatively less than a thickness t1 of the first sheet 111, while having a saturation magnetic flux density at least two times greater in value than that of the first sheet 111.

As an example, the thickness t1 of the first sheet 111 may be 2 to 6.7 times the thickness t2 of the second sheet 112, and the first sheet 111 may be provided to have a saturation magnetic flux density whose value is 0.1 to 0.5 times greater than that of a saturation magnetic flux density of the second sheet 112.

As a non-limiting example, the thickness t1 of the first sheet 111 may be 60 to 120 μm, and the thickness t2 of the second sheet 112 may be 18 to 30 μm. In addition, the saturation magnetic flux density of the first sheet 111 may be 0.2 to 0.5 tesla (T), and the saturation magnetic flux density of the second sheet 112 may be 1 to 2 T.

Accordingly, when a WPS function for charging a battery of an electronic device employing permanent magnets is performed, the magnetic shielding sheet 100 for a wireless power reception module according to one embodiment of the present invention may prevent a magnetic saturation problem caused by the permanent magnets while having a very small thickness of 150 μm or less and thus may realize a charging efficiency of 32% or more for charging another electronic device through the WPS function.

In this case, the permeability of the first sheet 111 may be 0.05 to 12 times the permeability of the second sheet 112, the first sheet 111 may be a magnetic sheet having a permeability of 300 to 3600, and the second sheet 112 may be a magnetic sheet having a permeability of 300 to 6000.

As an example, the first sheet 111 may be a ferrite sheet, and the second sheet 112 may be a ribbon sheet made of an amorphous alloy or nanocrystalline alloy.

Here, the ferrite sheet may be Ni—Zn ferrite or Mn—Zn ferrite, and the ribbon sheet may be a heat-treated Fe-based alloy ribbon. The Fe-based alloy may be a ternary alloy composed of iron (Fe), silicon (Si), boron (B), and other impurities, a quaternary alloy composed of iron (Fe), boron (B), carbon (C), copper (Cu), and other impurities, and a quinary alloy composed of iron (Fe), silicon (Si), boron (B), copper (Cu), niobium (Nb), and other impurities, or iron (Fe), boron (B), carbon (C), copper (Cu), niobium (Nb), and other impurities. In addition, the structure of the Fe-based alloy may include an amorphous or nanocrystalline structure.

That is, in the magnetic shielding sheet 100 for a wireless power reception module according to one embodiment of the present invention, the first sheet 111 may be a ferrite sheet having a thickness of 60 to 120 μm and a saturation magnetic flux density of 0.2 to 0.5 T, the second sheet 112 may be a ribbon sheet of an amorphous alloy or nanocrystalline alloy having a thickness of 18 to 30 μm and a saturation magnetic flux density of 1 to 2 T, and the second sheet 112 may be laminated on one surface of the first sheet 111 by means of the bonding adhesive layer 113.

thickness of 20 μm, and an overall thickness is 115 μm, as Example 3.

In addition, Table 1 below shows the results of the charging efficiency for each power of a magnetic shielding sheet which has an overall thickness of 95 μm including an adhesive layer by laminating four layers of ribbon sheets of a nanocrystalline alloy with a thickness of 18 μm, as Comparative Example 1, and a magnetic shielding sheet which is a ferrite sheet having a thickness of 100 μm and has an overall thickness of 120 μm including an adhesive layer, as Comparative Example 2.

|  | Comparative Example 1 | Comparative Example 2 | Example 1 | Example 2 | Example 3 |
| --- | --- | --- | --- | --- | --- |
| Overall thickness (μm) | 95 | 120 | 115 | 113 | 115 |
| Ls (200 kHz) (μH) | 9.04 | 9.11 | 9.07 | 9.28 | 8.80 |
| Rs (200 kHz) (mΩ) | 623 | 593 | 567 | 644 | 605 |
| 5.5 W (500 mA) | 64.4% | 64.9% | 65.1% | 64.6% | 63.5% |
| 6.6 W (600 mA) | 67.0% | 67.7% | 67.8% | 67.1% | 66.4% |
| 7.7 W (700 mA) | 68.9% | 69.4% | 69.6% | 69.1% | 68.1% |
| 8.8 W (800 mA) | 70.0% | 70.7% | 70.9% | 70.5% | 69.5% |
| 9.9 W (900 mA) | 70.9% | 71.5% | 71.5% | 71.2% | 70.7% |
| 10.9 W (1000 mA) | 71.4% | 72.1% | 71.8% | 71.8% | 70.8% |
| 12.0 W (1100 mA) | 71.7% | 72.2% | 72.1% | 71.9% | 70.5% |
| Power Share | 30.1% | 19.8% | 36.0% | 37.5% | 32.6% |

Accordingly, the magnetic shielding sheet 100 for a wireless power reception module according to one embodiment of the present invention may prevent magnetic saturation caused by the permanent magnets through the second sheet 112 having a high saturation magnetic flux density, while smoothly shielding a magnetic field through the first sheet 111, even when the overall thickness t is a very small thickness of 150 μm or less.

In addition, the magnetic shielding sheet 100 for a wireless power reception module according to one embodiment of the present invention may minimize the use amount of ribbon sheet by forming the ribbon sheet having a relatively high manufacturing cost as compared to the ferrite sheet to have a relatively very small thickness, thereby reducing the manufacturing cost and increasing price competitiveness.

Accordingly, a wireless power reception module 200 to which the magnetic shielding sheet 100 for a wireless power reception module according to one embodiment of the present invention is applied may prevent a magnetic saturation problem caused by permanent magnets when a WPS function for charging a battery of an electronic device employing the permanent magnets is performed, even though the magnetic shielding sheet 100 has a very small thickness of 150 μm or less, and thus may realize a charging efficiency of 32% or more for charging another electronic device through the WPS function.

This may be seen in Table 1 below.

Table 1 below shows the results of the charging efficiency for each power of a magnetic shielding sheet in which the first sheet 111 is an Mn—Zn ferrite sheet with a thickness of 80 μm, the second sheet 112 is a ribbon sheet of an amorphous alloy with a thickness of 20 μm, and an overall thickness is 115 μm, as Example 1, a magnetic shielding sheet in which the first sheet 111 is an Mn—Zn ferrite sheet having a thickness of 80 μm, the second sheet 112 is a ribbon sheet of a nanocrystalline alloy having a thickness of 18 μm, and an overall thickness is 113 μm, as Example 2, and a magnetic shielding sheet in which the first sheet 111 is a Ni—Zn ferrite sheet having a thickness of 80 μm, the second sheet 112 is a ribbon sheet of an amorphous alloy having a As can be seen from Table 1 above, it can be seen that when a magnet shielding s is configured in a hybrid form in which a relatively thin ribbon sheet is laminated on one surface of a ferrite sheet, the efficiency of charging another electronic device through a WPS function is further increased as compared to a magnetic shielding sheet composed of a ribbon sheet or a ferrite sheet alone.

Accordingly, the magnetic shielding sheet 100 for a wireless power reception module according to one embodiment of the present invention may realize a charging efficiency of 32% or more for charging another electronic device through the WPS function while having a very small thickness of 150 μm or less in overall thickness, while minimizing the increase in manufacturing cost by forming the ribbon sheet, which has a higher manufacturing cost than the ferrite sheet, to have a relatively very small thickness.

As a result, the wireless power reception module 200 to which the magnetic shielding sheet 100 for a wireless power reception module according to one embodiment of the present invention is applied may maintain the thickness of the magnetic shielding sheet 100 to be 150 μm or less, and thus may be installed in a mobile, phone, a laptop computer, or the like having a limited thickness.

Figure 3:
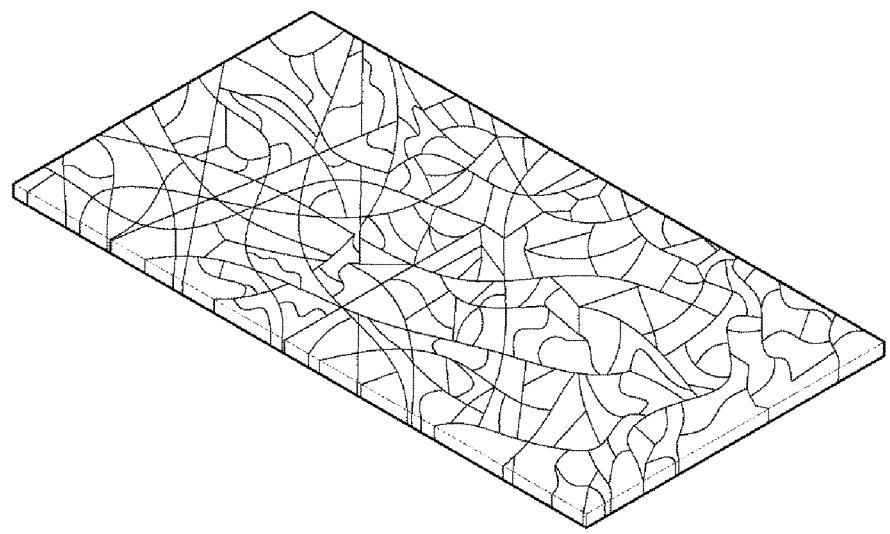
FIG. 3 is a view illustrating a first sheet and a second sheet applicable to FIG. 1.

Meanwhile, each of the first sheet 111 and the second sheet 112 may be formed as a plate-shaped sheet, but as shown in FIG. 3, at least one of the first sheet 111 and the second sheet 112 may be divided into a plurality of pieces to improve flexibility and increase overall resistance in order to reduce an effect due to an eddy current.

In this case, a specific resistance of the first sheet 111 may be higher than a specific resistance of the second sheet 112 in a state before each of the first sheet 111 and the second sheet 112 is divided into a plurality of pieces. As an example, the specific resistance of the first sheet 111 may be $5.0*10^9$ to $2.0*10^{14}$ times that of the second sheet 112.

Figure 4:
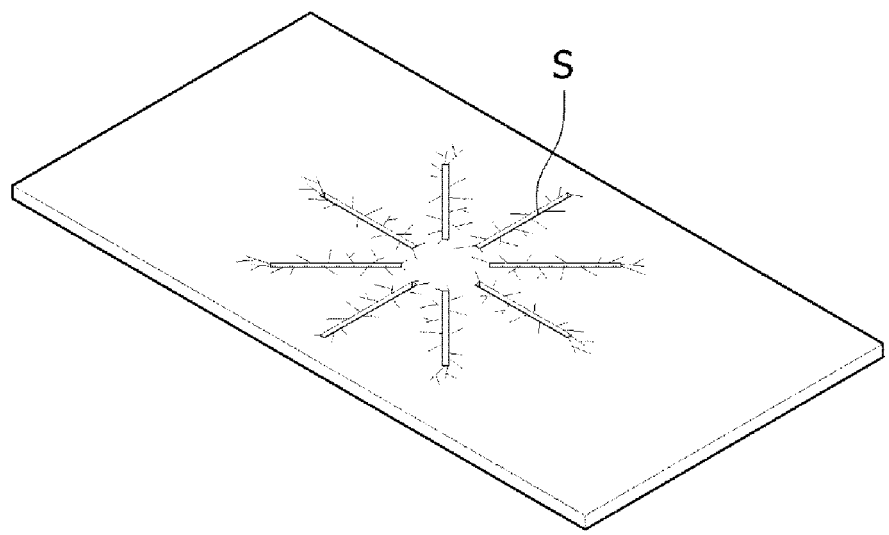
FIG. 4 is a view illustrating a first sheet applicable to FIG. 1.

Alternatively, as shown in FIG. 4, each of the first sheet 111 and the second sheet 112 may have at least one slot S formed through a local area of the entire area in order to realize a high permeability while reducing an influence by an eddy current. In this case, depending on the material of the sheet itself, a plurality of cracks extending from the slot S may be formed around the slot S.

Meanwhile, the magnetic shielding sheet 100 for a wireless power reception module according to one embodiment of the present invention may include a pair of attachment adhesive layers 122 provided on both surfaces of the sheet body 110, and a pair of protective films 120 may be respectively attached to both surfaces of the sheet body 110 by means of the pair of attachment adhesive layers 122.

In this case, the pail of protective films 120 may be release films removed during use, and the attachment adhesive lavers 122 may be used to fix a wireless power reception antenna 214 to one surface of the first sheet 111 or to attach the sheet body 110 to a place of use.

Here, the overall thickness t of the magnetic shielding sheet 100 for a wireless power reception module according to one embodiment of the present invention may be a thickness including the pair of protective films 120, but may mean the remaining thickness except for the thickness of the pair of protective films 120 which are release films.

The above-described magnetic shielding sheet 100 for a wireless power reception module according to one embodiment of the present invention may be realized as the wireless power reception module 200.

Figure 5:
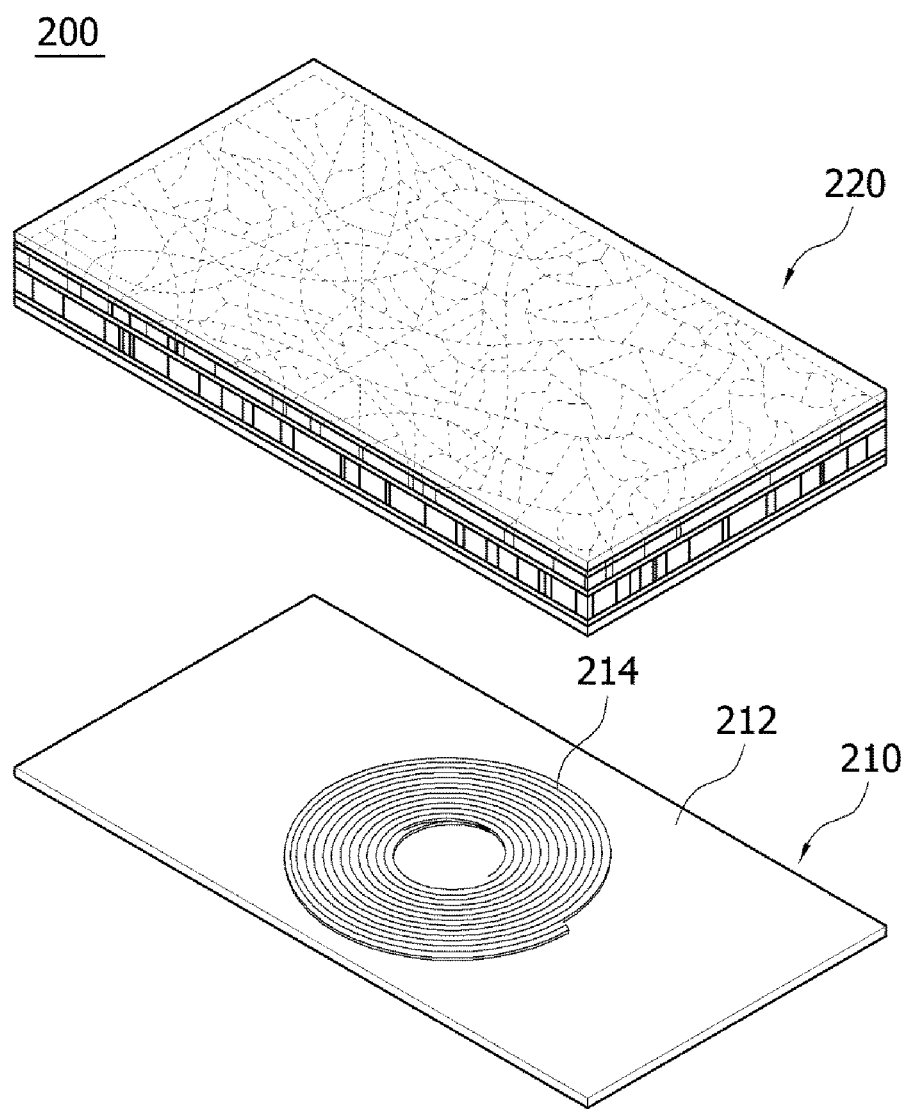
FIG. 5 is a view illustrating a wireless power reception module according to one embodiment of the present invention.

As an example, as shown in FIG. 5, the wireless power reception module 200 may include an antenna unit 210 including the wireless power reception antenna 214 for wireless power reception and a magnetic shielding sheet 220 that is disposed on one surface of the antenna unit 210 to shield a magnetic field and focus the magnetic field in a desired direction.

Here, the wireless power reception module 200 may be a reception module capable of performing the VPS function as described above, and the magnetic shielding sheet 220 may be the above-described magnetic shielding sheet 100 for a wireless power reception module.

In addition, the wireless power reception antenna 214 may be a flat type coil in which a conductive member is wound in a loop shape, but may be an antenna pattern formed on at least one surface of a circuit board 212.

In this case, the circuit board 212 in which the wireless power reception antenna 214 is patterned may be attached to one surface of the magnetic shielding sheet 220 by means of the above-described attachment adhesive layer 122. That is, the circuit board 212 in which the wireless power reception antenna 214 is patterned may be attached to one surface of the first sheet 111 by means of the attachment adhesive layer 122.

In addition, the wireless power reception module 200 may be applied to a portable terminal such as a mobile phone, a tablet personal computer (PC), or the like, a laptop computer, and the like.

Although one embodiment of the present invention has been described above, the spirit of the present invention is not limited to the embodiment shown in the present specification, and although those skilled in the art may propose other embodiments through the addition, change, or removal of components within the scope of the same spirit of the present invention, such embodiments are also included in the scope of the present invention.

The invention claimed is:

1. A magnetic shielding sheet for a wireless power reception module, which is applied to a wireless power reception module capable of a wireless power share (WPS) function for charging a battery of an electronic device that employs a permanent magnet and has an overall thickness of 150 μm or less, the magnetic shielding sheet comprising:

a first sheet made of a magnetic material to shield a magnetic field; and a second sheet laminated as a monolayer on one surface of the first sheet by means of a bonding adhesive layer, wherein the first sheet is provided with a thickness of 60 to 120 μm, which is 2 to 6.7 times thicker than a thickness of the second sheet so as to serve as a main shielding sheet that shields a magnetic field, and wherein the second sheet is provided with a thickness of 18 to 30 μm, which is thinner than a thickness of the first sheet while having a saturation magnetic flux density of 1 tesla (T) to 2 T, which is twice or more than a saturation magnetic flux density of the first sheet of 0.2 to 0.5 T, so as to prevent magnetic saturation by the permanent magnet when the WPS function is performed, and supplement the shielding performance of the first sheet to increase the charging efficiency of the electronic device such that the total thickness of the magnetic field shielding sheet can be 150 μm or less.

2. The magnetic shielding sheet of claim 1, wherein a permeability of the first sheet is 0.05 to 12 times a permeability of the second sheet.

3. The magnetic shielding sheet of claim 2, wherein the permeability of the first sheet is 300 to 3600, and the permeability of the second sheet is 300 to 6000.

4. The magnetic shielding sheet of claim 1, wherein the first sheet is a ferrite sheet, and the second sheet is a ribbon sheet of an amorphous alloy or a nanocrystalline alloy.

5. The magnetic shielding sheet of claim 1, wherein each of the first sheet and the second sheet is a sheet formed by being divided into a plurality of pieces.

6. The magnetic shielding sheet of claim 1, comprising an attachment adhesive lave disposed on one surface of the first sheet, wherein a wireless power reception antenna is attached to the one surface of the first sheet by means of the attachment adhesive layer.

7. A wireless power reception module comprising:

a wireless power reception antenna capable of a wireless power share (WPS) function for charging a battery of an electronic device that employs a permanent magnet; and a magnetic shielding sheet disposed one surface of the wireless power reception antenna, wherein the magnetic shielding sheet is the magnetic shielding sheet, wherein the magnetic shielding sheet has an overall thickness of 150 μm or less, wherein the magnetic shielding sheet comprises:

a first sheet made of a magnetic material to shield a magnetic field; and a second sheet laminated as a monolayer on one surface of the first sheet by means of a bonding adhesive layer, wherein the first sheet is provided with a thickness of 60 to 120 μm, which is 2 to 6.7 times thicker than a thickness of the second sheet so as to serve as a main shielding sheet that shields a magnetic field, and wherein the second sheet is provided with a thickness of 18 to 30 μm, which is thinner than a thickness of the first sheet while having a saturation magnetic flux density of 1 tesla (T) to 2T, which is twice or more than a saturation magnetic flux density of the first sheet of 0.2 to 0.5 T, so as to prevent magnetic saturation by the permanent magnet when the WPS function is performed, and supplement the shielding performance of the first sheet to increase the charging efficiency of the electronic device such that the total thickness of the magnetic field shielding sheet can be 150 μm or less.

8. The wireless power reception module of claim 7, wherein a permeability of the first sheet is 0.05 to 12 times a permeability of the second sheet.

9. The wireless power reception module of claim 8, wherein the permeability of the first sheet is 300 to 3600, and the permeability of the second sheet is 300 to 6000.

10. The wireless power reception module of claim 7, wherein the first sheet is a ferrite sheet, and the second sheet is a ribbon sheet of an amorphous alloy or a nanocrystalline alloy.

11. The wireless power reception module of claim 7, wherein each of the first sheet and the second sheet is a sheet formed by being divided into a plurality of pieces.

12. The wireless power reception module of claim 7, comprising an attachment adhesive layer disposed on one surface of the first sheet,
wherein the wireless power reception antenna is attached to the one surface of the first sheet by means of the attachment adhesive layer.

\* \* \* \* \*